(12) United States Patent
Takeya

(10) Patent No.: US 7,791,869 B2
(45) Date of Patent: Sep. 7, 2010

(54) ELECTRONIC DEVICE INCLUDING A ROTATION UNIT

(75) Inventor: Tsutomu Takeya, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 127 days.

(21) Appl. No.: 12/256,764

(22) Filed: Oct. 23, 2008

(65) Prior Publication Data

US 2009/0052123 A1 Feb. 26, 2009

(30) Foreign Application Priority Data

Jan. 11, 2007 (JP) ............................. 2007-003734
Jan. 9, 2008 (WO) ................. PCT/JP2008/050104

(51) Int. Cl.
*G06F 1/16* (2006.01)

(52) U.S. Cl. .............................. 361/679.27; 248/176.1; 340/815.86; 378/95

(58) Field of Classification Search ............ 361/679.27, 361/679.55, 679.06, 679.21, 679.29; 248/187, 248/176.1, 917; 345/175, 30, 111, 173, 649, 345/204; 340/815.62, 815.86, 319, 815.4; 604/22, 288.01; 378/4, 19, 57, 95
See application file for complete search history.

(56) References Cited

U.S. PATENT DOCUMENTS

| 6,278,431 | B1 * | 8/2001 | Kao ............................ 345/111 |
| 7,088,343 | B2 * | 8/2006 | Smith et al. ................. 345/173 |
| 2007/0145209 | A1 * | 6/2007 | Marsilio et al. .......... 248/176.1 |
| 2008/0238816 | A1 * | 10/2008 | Matsushita .................... 345/30 |

* cited by examiner

*Primary Examiner*—Hung V Duong
(74) *Attorney, Agent, or Firm*—Brinks Hofer Gilson & Lione

(57) ABSTRACT

A rotation unit is supported to a device main body unit so as to rotate about a rotation supporting point. The rotation unit is rotated from a closure posture close to the device main body unit until a rotation limit position at 180 degrees. A magnet is fixed to the rotation unit at a position away from the rotation supporting point, and the device main body unit is provided with a detector capable of distinctly detect magnetic fields in two directions. When the rotation unit is rotated from the closure posture at a predetermined angle, a first open detection output is obtained form the detector and a display unit provided to the rotation unit is turned ON. The rotation unit is further rotated and when a second open detection output is obtained from the detector, the display content of the display unit is switched to be turned upside down.

11 Claims, 12 Drawing Sheets

ELECTRONIC DEVICE INCLUDING A ROTATION UNIT

CLAIM OF PRIORITY

This application claims benefit of the Japanese Patent Application No. 2007-003734 filed on Jan. 11, 2007, which is hereby incorporated by reference.

BACKGROUND OF THE INVENTION

1. Field of the Invention

The present invention relates to an electronic device including a rotation unit provided with a display unit, the rotation unit being capable of detecting a rotating angle of the rotation unit by using a detector capable of detecting a direction and an intensity of magnetic field.

2. Description of the Related Art

In a book-type personal computer, an in-vehicle display device, or the like, a rotation unit having a display unit such as a liquid crystal panel is freely rotatably mounted to a device main body unit. In an electronic device of this type, a sensor for detecting a rotation angle of the rotation unit is provided. When a sensor detects that the rotation unit is rotated up to a predetermined angle, a display of the display unit is turned ON or turned OFF, or display content is switched.

Japanese Unexamined Patent Application Publication No. 2002-132385 discloses a note-type personal computer, in which a detection of a rotation angle of a rotation unit is performed by using an angle sensor built in a hinge part. Japanese Unexamined Patent Application Publication No. 10-309996 discloses an in-vehicle display device having a rotation unit. In this display device, an angle of the rotation unit is detected on the basis of an encoder type detection method or a micro switch.

However, when the angle sensor or the encoder is mounted to the hinge part of the rotation unit, a structure of the hinge part becomes complicated. Also, each time the rotation unit is rotated, the mechanical component such as the angle sensor or the encoder contact or slide, and the life of the angle sensor or the encoder is unavoidably shortened. In addition, the micro switch needs to be arranged at the hinge part of the rotation unit, and it is difficult to find an arrangement space.

SUMMARY OF THE INVENTION

The present invention has been made in order to solve the above-described problems and provides an electronic device including a rotation unit provided with a display unit, the rotation unit being capable of detecting a rotating angle of the rotation unit by using a non-contact and non-sliding type detector, in which a setting of a detection timing is also easily performed.

According to an embodiment of the present invention, there is provided an electronic device including: a device main body unit; a rotation unit freely rotatably supported to the device main body unit; a display unit provided to the rotation unit, the rotation unit rotating between a closure posture in which the display unit faces the device main body unit and a display posture in which the display unit is away from the device main body; a magnet provided to one of the device main body unit and the rotation unit; and a detector provided to the other of the device main body unit and the rotation unit, in which: diverse magnetic poles of the magnet are arranged in mutually opposite directions in a surface orthogonal to a rotation central line of the rotation unit; the detector has a fixed magnetic layer in which a direction of magnetization is fixed and a free magnetic layer in which the magnetization is changed due to external magnetic field and is composed of a magnetoresistance effect element capable of detecting the direction and intensity of the external magnetic field on the basis of the direction of the magnetization of the fixed magnetic layer and the direction of the magnetization of the free magnetic layer; and the detector detects an intensity change of the magnetization in one direction output from the magnet and obtains a first open detection output when the rotation unit is rotated at a predetermined angle from the closure posture to the display posture, and the detector detects an intensity change of the magnetization in the other direction output from the magnet and obtains a second open detection output when the rotation unit is further rotated toward the display posture after the first open detection output is obtained.

For example, when the rotation unit is rotated at an angle above 150 degrees from the closure posture, the second open detection output may be obtained from the detector.

In the electronic device including the rotation unit according to the embodiment of the present invention, the detection state of the rotation unit can be detected by using the magnet and the detector. By using the detector capable of detecting the direction of the magnet field and the intensity of the magnet field, on the basis of the one detector, it is possible to detect the detection state of the rotation unit can be detected at the two angles. In addition, as the detector is the non-contact type detection means, the possibility that a failure is generated is small even when the detector is used for a long period of time.

For example, according to an embodiment of the present invention, when the first open detection output is obtained as the rotation unit is rotated from the closure posture to the display posture, a display of the display unit may be turned ON, and when the second open detection output is obtained, a display content of the display unit may be switched.

The switching of the display content herein means, for example, a switching from a display of a still image to the display of a video, a switching of a display language, and the like.

Alternatively, according to an embodiment of the present invention, when the first open detection output is obtained as the rotation unit is rotated from the closure posture to the display posture, a display of the display unit may be turned ON, and when the second open detection output is obtained, a content displayed on the display unit may be turned upside down to be displayed.

In this manner, when the display content of the display unit is turned upside down, by rotating the rotation unit up to an angle close to 180 degrees or above, it is possible to present the display content to a facing person, which is effective for a setting of so-called presentation mode.

According to an embodiment of the present invention, an angle and a direction of the magnet and the detector are preferably set to have a rotation angle of the rotation unit up to a rotation limit position of the display posture is reached after the second open detection output is obtained, smaller than a rotation angle of the rotation unit from the closure posture up to an angle at which the first open detection output is obtained.

With the above-described configuration, the following configuration can be adopted. When the rotation unit is rotated somewhat largely from the closure posture and the display unit is located to be seen by eyes, the display unit is turned ON, and furthermore, only when the rotation unit is rotated largely, the display is switched."

Furthermore, according to an embodiment of the present invention, when the rotation unit is rotated at a predetermined angle from a rotation limit position of the display posture to the closure posture, a second closure detection output may be obtained, and when the rotation unit is rotated at a predetermined angle toward the closure posture after the second closure detection output is obtained, a first closure detection output may be obtained.

In this case, a rotation angle of the rotation unit from the rotation limit position up to an angle at which the second closure detection output is obtained is preferably larger than a rotation angle of the rotation unit up to the rotation limit position after the second closure detection output is obtained.

In this case, for example, when the second closure detection output is obtained as the rotation unit is rotated from the rotation limit position toward the closure posture, the display content of the display unit may be returned to an original state.

Also, according to an embodiment of the present invention, a rotation angle of the rotation unit toward the closure posture after the first closure detection output is obtained is preferably smaller than a rotation angle of the rotation unit from the closure posture up to an angle at which the first closure detection output is obtained.

In this case, for example, when the first closure detection output is obtained as the rotation unit is rotated toward the closure posture, the display of the display unit may be turned OFF.

Furthermore, according to an embodiment of the present invention, the detector may include a detection element adapted to utilize a magnetoresistance effect.

According to the embodiment of the present invention, by using the non-contact and non-sliding type detection means, it is possible to detect, at a plurality of positions, the rotation posture of the rotation unit having the display unit. For that reason, it is possible to perform the setting of the display state in accordance with the rotation angle of the rotation unit. In addition, it is also possible to perform the setting of the timing at which the detection output is obtained and the rotation angle of the rotation unit.

DESCRIPTION OF THE PREFERRED EMBODIMENTS

Figure 1:
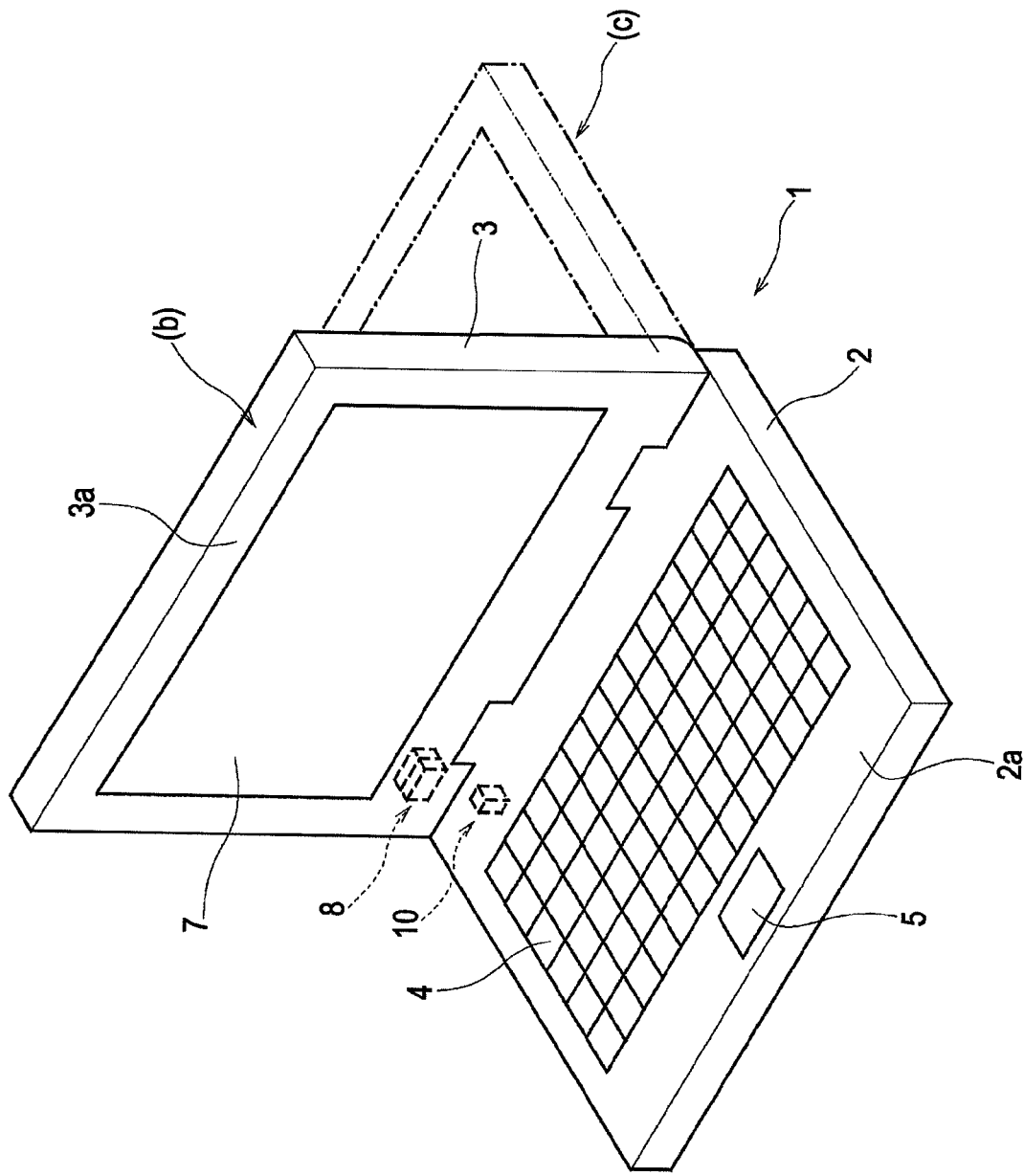
FIG. 1 is a perspective view of an electronic device according to a first embodiment of the present invention.
Figure 2:
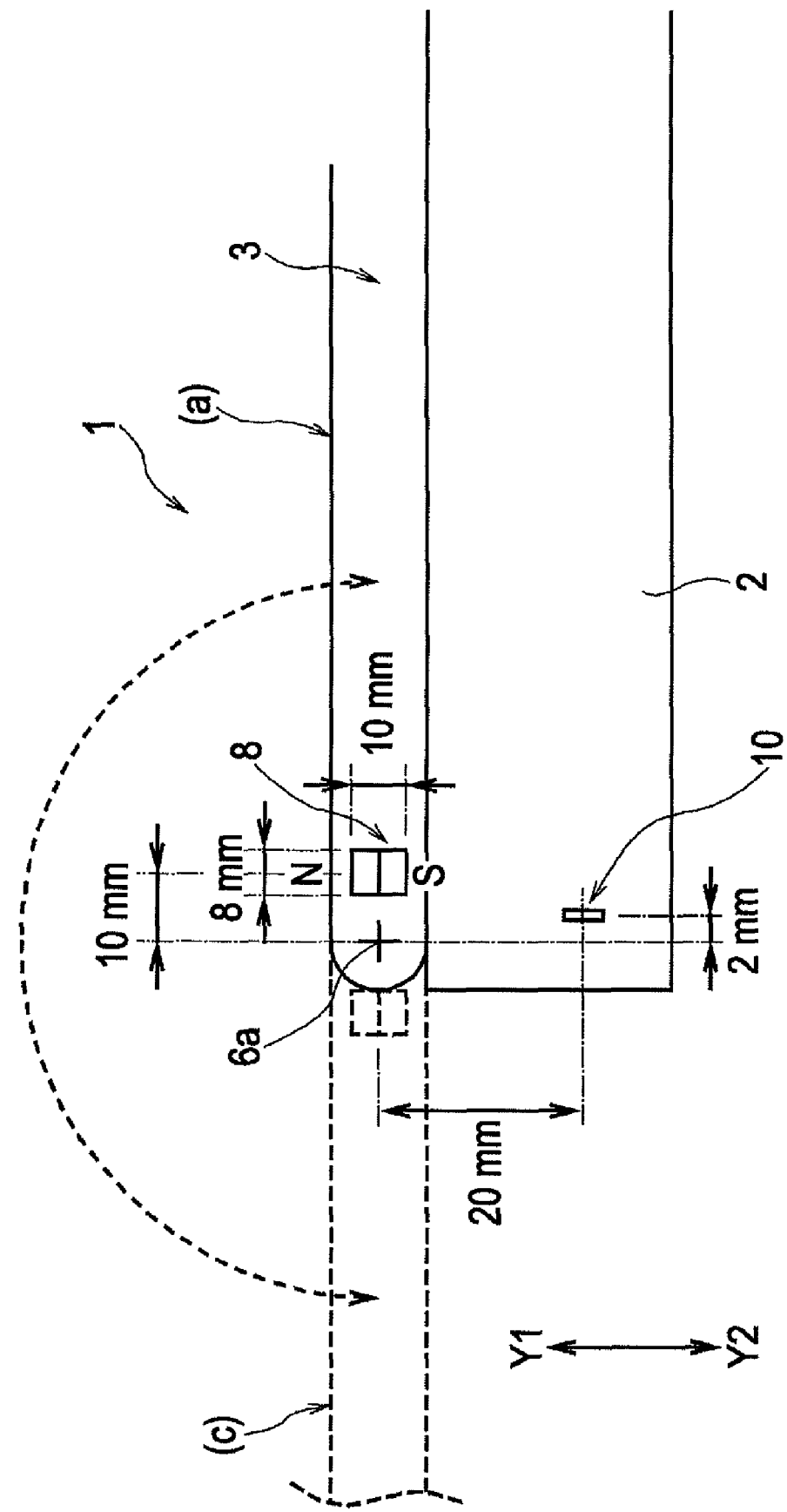
FIG. 2 is a side view of the electronic device according to the first embodiment of the present invention.
Figure 3:
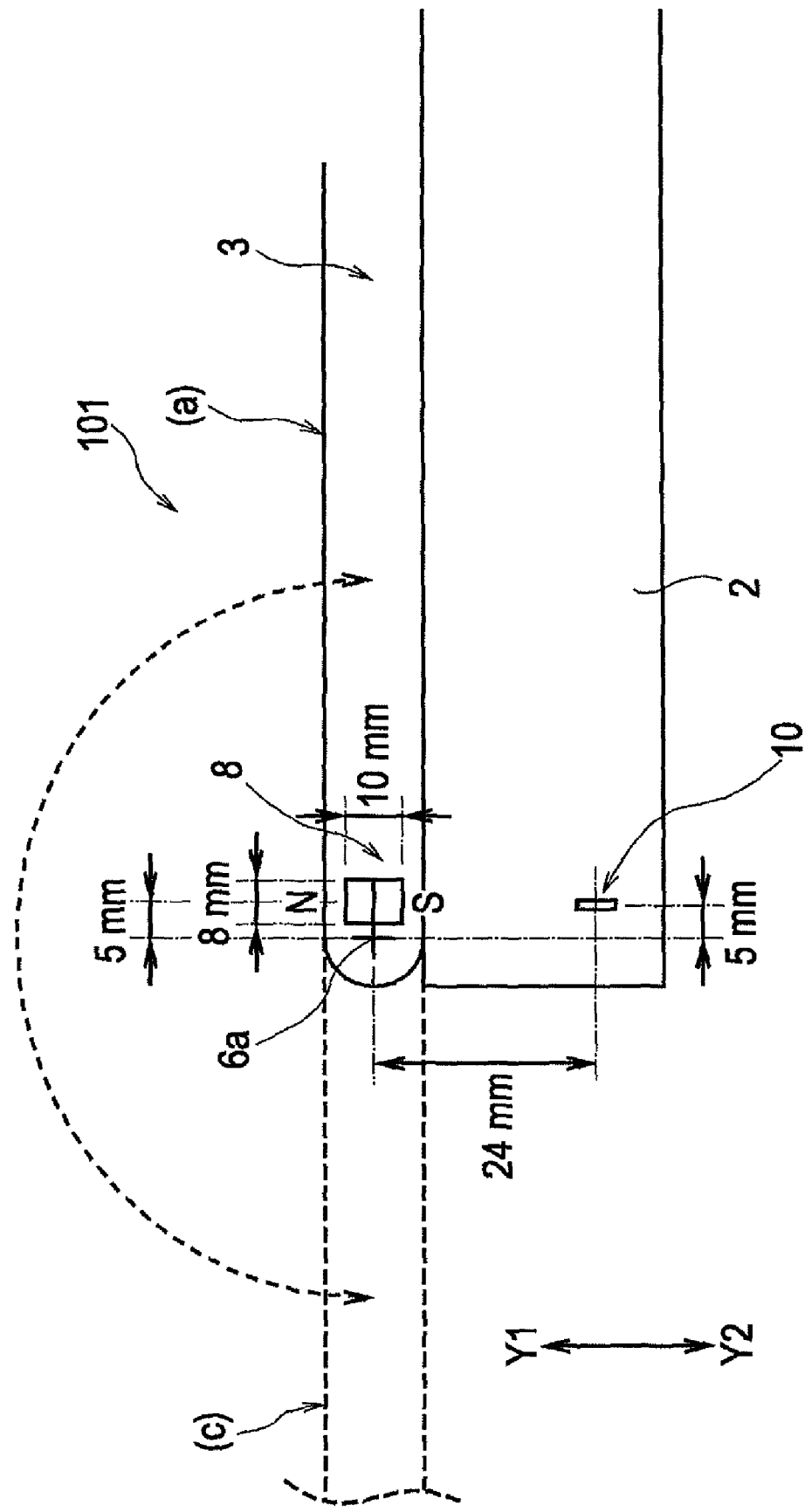
FIG. 3 is a side view of an electronic device according to a modified example of the first embodiment.

FIG. 1 is a perspective view of an electronic device 1 according to a first embodiment of the present invention, FIG. 2 is a side view of the electronic device 1, and FIG. 3 is a side view of an electronic device 101 according to a modified example of the first embodiment.

The electronic device 1 illustrated in FIG. 1 is a note-type personal computer and includes a device main body unit 2 and a rotation unit 3. A casing of the device main body unit 2 contains a circuit board to which electric components constituting a CPU or a memory are mounted. A top face of the device main body unit 2 is an operation face 2a. On the operation face 2a, a keyboard input apparatus 4 and a capacitance flat-type input apparatus 5 are provided.

On a display face 3a of the rotation unit 3, a screen of a display unit 7 such as a liquid crystal panel. The rotation unit 3 is freely rotatably mounted to the device main body unit 2 about a rotation supporting point 6a or 6b illustrated in FIGS. 2 and 3. As illustrated in FIGS. 2 and 3, the rotation unit 3 can set a closure posture (a) in which while facing the operation face 2a of the device main body unit 2, the display face 3a of the display unit 7 is overlapped on the operation face 2a with almost no gap. In addition, the rotation unit 3 sets a display posture as the display face 3a is rotated to a position away from the operation face 2a of the device main body unit 2. FIG. 1 illustrates a display posture (b) in which the display face 3a of the rotation unit 3 is substantially orthogonal to the operation face 2a of the device main body unit 2. As illustrated in broken lines in FIGS. 1 to 3, the rotation unit 3 can be rotated up to a rotation limit position (c) where the display face 3a faces right above. The rotation angle of the rotation unit 3 from the closure posture (a) to the rotation limit position (c) is 180 degrees.

In order to detect the rotation angle of the rotation unit 3, the rotation unit 3 is provided with a magnet 8 at a position in the vicinity of the rotation supporting point 6a or 6b, and the device main body unit 2 is provided with a detector 10. As illustrated in FIGS. 2 and 3, the magnet 8 is set in such a manner that the north pole faces a Y1 side which is an upper side in the thickness direction of the device main body unit 2 and the south pole faces a Y2 side which is a lower side in the thickness direction of the device main body unit 2 when the rotation unit 3 is in the closure posture (a).

By utilizing a magnetoresistance effect, the detector 10 can detect the direction of the magnetic field and the intensity of the magnetic field, detect a magnetic field component in the Y1 direction which is the thickness direction of the device main body unit 2 and a magnetic field component in the Y2 direction in distinction from each other, and also detect the magnetic field intensity in the Y1 direction and the magnetic field intensity in the Y2 direction.

The detector 10 is configured in the following manner.

Figure 11A:
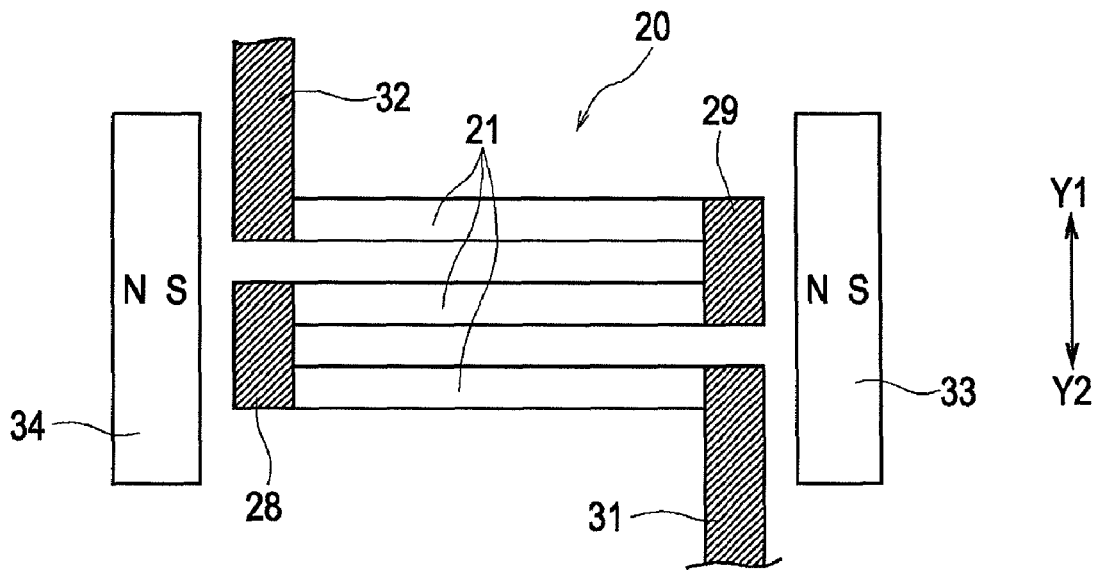
FIG. 11A is a plan view of a structure of a magnetoresistance effect element.
Figure 11B:
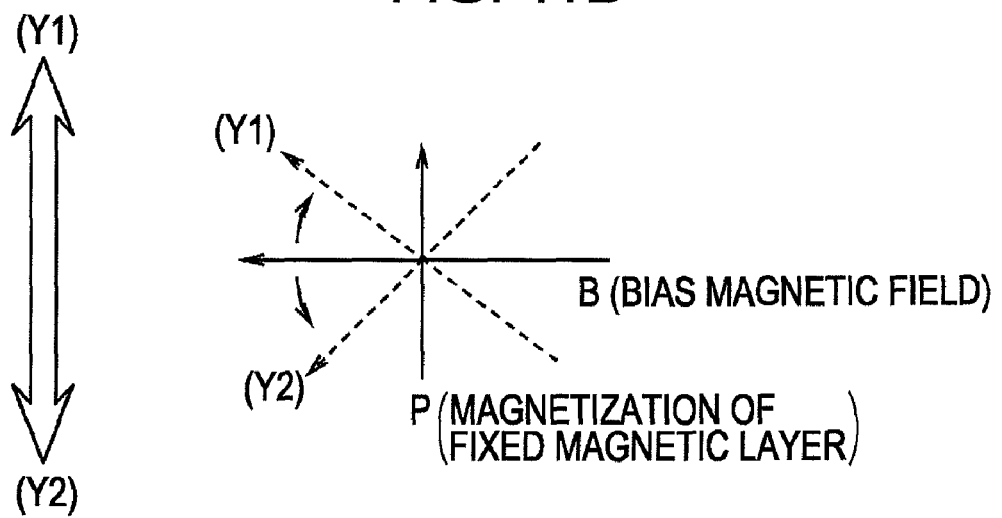
FIG. 11B is an explanatory diagram for describing a magnetization direction of a fixed magnetic layer of the magnetoresistance effect element and a direction of a bias magnetic field.
Figure 12:
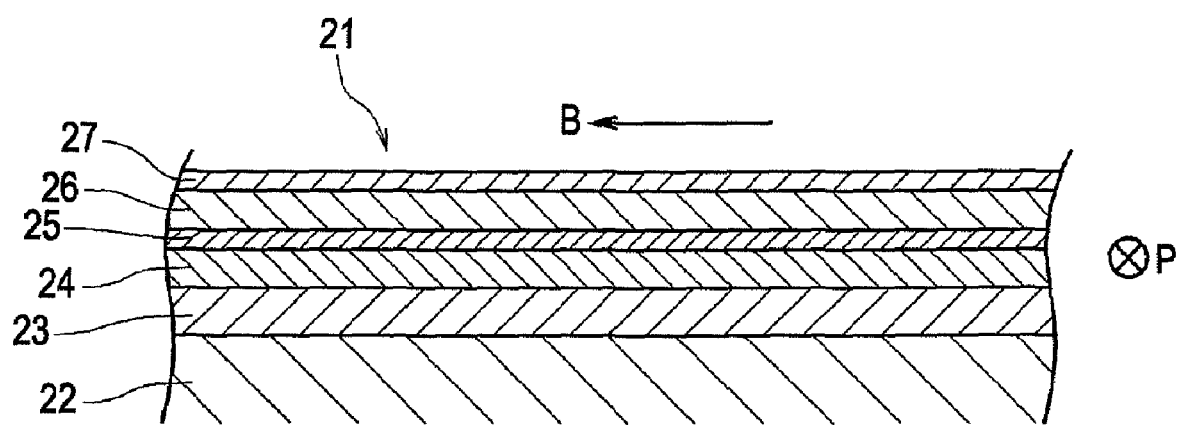
FIG. 12 is a cross-sectional view of an element part of the magnetoresistance effect element.
Figure 13:
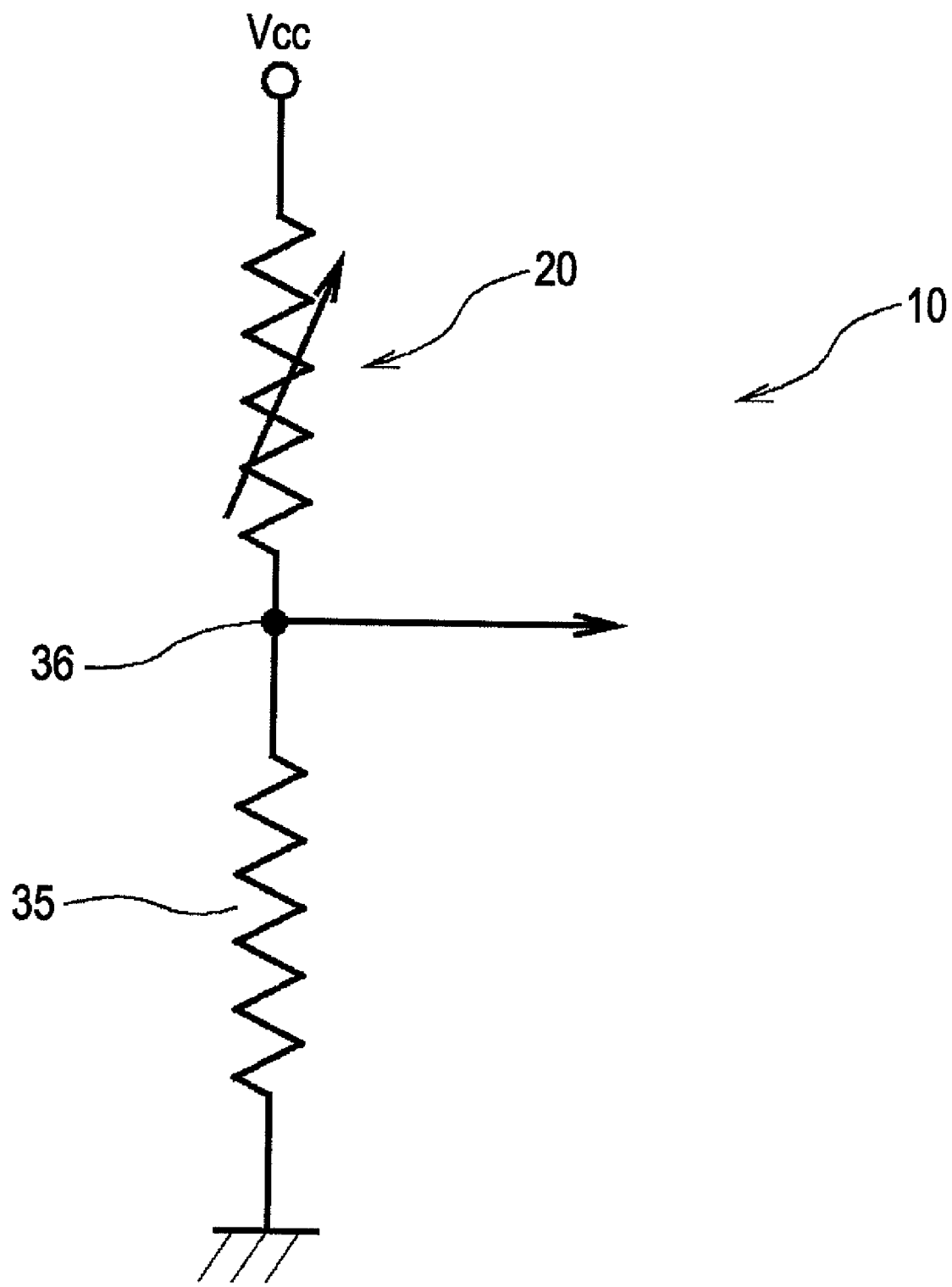
FIG. 13 is a circuit diagram of the detector.

The detector 10 is configured by using a magnetoresistance effect element 20 having the structure illustrated in FIGS. 11A and 11B and FIG. 12 and incorporating a circuit illustrated in FIG. 13.

As illustrated in FIG. 11A, a plurality of element parts 21 of the magnetoresistance effect element 20 are provided and formed in parallel with one another. The longitudinal direction of the respective element parts 21 extends in a direction orthogonal to the Y1-Y2 direction. The longitudinal direction of the respective element parts 21 may be a direction parallel to a paper surface of FIGS. 2 and 3 or may be a direction orthogonal to the paper surface.

As illustrated in a cross-sectional view of FIG. 12, the respective element parts 21 are a giant magnetoresistance effect element (GMR element) formed by laminating in the stated order on a substrate, an antiferromagnetic layer 23, a fixed magnetic layer 24, a non-magnetic conductive layer 25, and a free magnetic layer 26 and covering a front surface of the free magnetic layer 26 with a protective layer 27.

The antiferromagnetic layer 23 is formed of an antiferromagnetic material such as an Ir—Mn alloy (iridium-manganese alloy). The fixed magnetic layer 24 is formed of a soft magnetic alloy such as a Co—Fe alloy (a cobalt-iron alloy). The non-magnetic conductive layer 25 is formed of Cu (copper) or the like. The free magnetic layer 26 is formed of a soft magnetic alloy such as an Ni—Fe alloy (nickel-iron alloy). The protective layer 27 is formed of Ta (tantalum).

In the element parts 21, due to an antiferromagnetic coupling between the antiferromagnetic layer 23 and the fixed magnetic layer 24, the direction of the magnetization of the fixed magnetic layer 24 is fixed. As illustrated in FIG. 11B, in the respective element parts 21, the fixed direction (P direction) of the magnetization of the fixed magnetic layer 24 is a direction orthogonal to the respective element parts 21 extending in the left and right direction. According to this embodiment, the fixed direction (P direction) of the magnetization of the fixed magnetic layer 24 is the Y1 direction.

As illustrated in FIG. 11A, two of each of the element parts 21 are connected via connection electrodes 28 and 29, and furthermore, the element parts 21 located at upper and lower end parts in the drawing are connected with extraction electrodes 31 and 32. Therefore, the respective element parts 21 are connected in series to form a meander type pattern.

As illustrated in FIG. 11A, in the respective element parts 21, a magnet 33 is provided on the right side and a magnet 34 is provided on the left side, and the bias magnetic field is provided with respect to the respective element parts 21 in the left side which is the longitudinal direction. Therefore, when the external magnetic field is not provided, the inside of the free magnetic layer 26 is in a single domain condition in a bias direction (B direction) which is the longitudinal direction. The bias direction (B direction) and the fixed direction (P direction) of the magnetization of the fixed magnetic layer 24 are orthogonal to each other.

As illustrated in FIGS. 11A and 11B, the magnetoresistance effect element 20 can distinctly the component of the magnetic field in the Y1 direction which is orthogonal to the longitudinal direction of the element parts 21 and the component of the magnetic field in the Y2 direction. When the magnetoresistance effect element 20 is provided with the component of the external magnetic field in the Y1 direction, the direction of the magnetization in the free magnetic layer 26 on which the bias magnetic field B affects faces the same direction as the Y1 direction, that is, the fixed direction (P direction) of the magnetization of the fixed magnetic layer 24. At this time, the electric resistance of the magnetoresistance effect element 20 is decreased. On the other hand, when the magnetoresistance effect element 20 is provided with the component of the external magnetic field in the Y2 direction, the direction of the magnetization in the free magnetic layer 26 is the Y2 direction, that is, a direction opposite to the fixed direction (P direction) of the magnetization of the fixed magnetic layer 24. At this time, the electric resistance of the magnetoresistance effect element 20 is increased.

As illustrated in FIG. 13, in the detector 10, the magnetoresistance effect element 20 and the fixed resistance element 35 are connected in series, the magnetoresistance effect element 20 and the fixed resistance element 35 connected in series are provided with a series voltage Vcc. Then, an intermediate point 36 between the magnetoresistance effect element 20 and the fixed resistance element 35 functions as an output part of a detection output.

Figure 14:
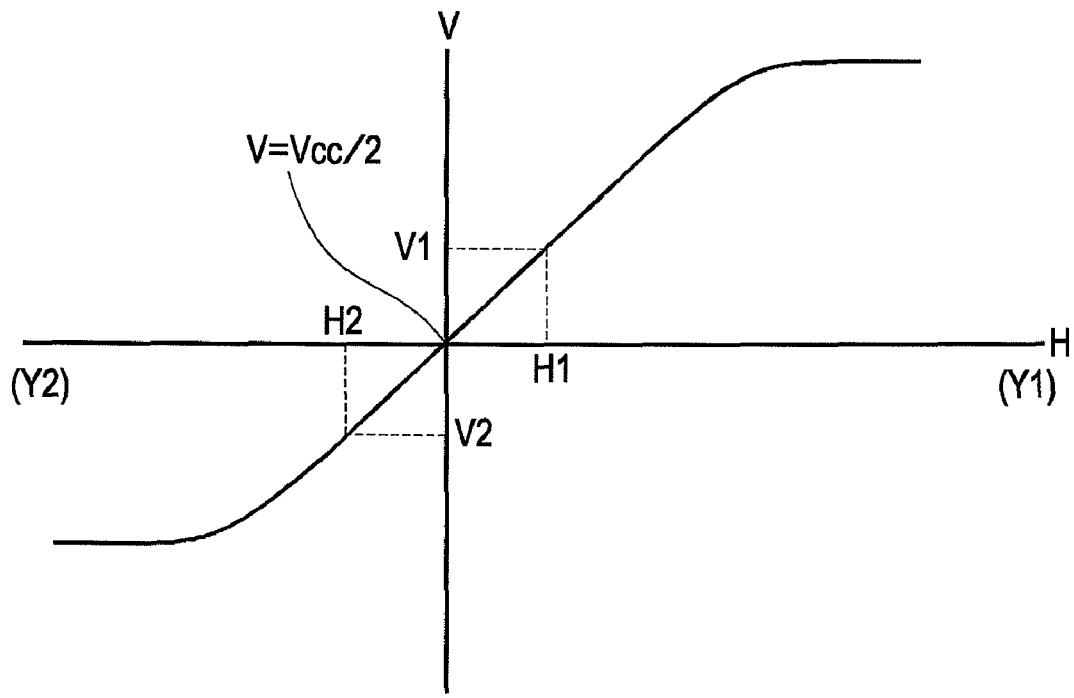
FIG. 14 is a line diagram of an output characteristic obtained from the detector.

FIG. 14 illustrates a relation of the component and the intensity of the external magnetic field which affects the magnetoresistance effect element 20 in the Y1 direction as well as the component and the intensity in the Y2 direction and the output voltage from the intermediate point 36. The fixed resistance element 35 is formed of the same material as the magnetoresistance effect element 20 illustrated, for example, in FIG. 12 in the same thickness, and also the laminating order for the non-magnetic conductive layer 25 and the free magnetic layer 26 is changed, for example, so that the electric resistance is not changed due to the external magnetic field and also the fixed resistance element 35 has the same temperature characteristic as that of the magnetoresistance effect element 20. In addition, when the external magnetic field is not in effect, in order that the detection output from the intermediate point 36 is set as Vcc/2, the resistance value of the fixed resistance element 35 is adjusted.

As illustrated in FIG. 14, the output voltage from the intermediate point 36 is set as Vcc/2 when the external magnetic field is not in effect. When the external magnetic field in the Y1 direction affects the magnetoresistance effect element 20, the output voltage from the intermediate point 36 is increased, and when the external magnetic field in the Y2 direction affects the magnetoresistance effect element 20, the output voltage from the intermediate point 36 is decreased.

Therefore, as illustrated in FIG. 14, by recognizing that the output voltage from the intermediate point 36 is set as a predetermined value V1, it is possible to detect that the size of the external magnetic field in the Y1 direction becomes equal to or larger than a predetermined value H1. Similarly, by recognizing that the output voltage from the intermediate point 36 is set as a predetermined value V2, it is possible to detect that the size of the external magnetic field in the Y2 direction becomes equal to or larger than a predetermined value H2.

Figure 15:
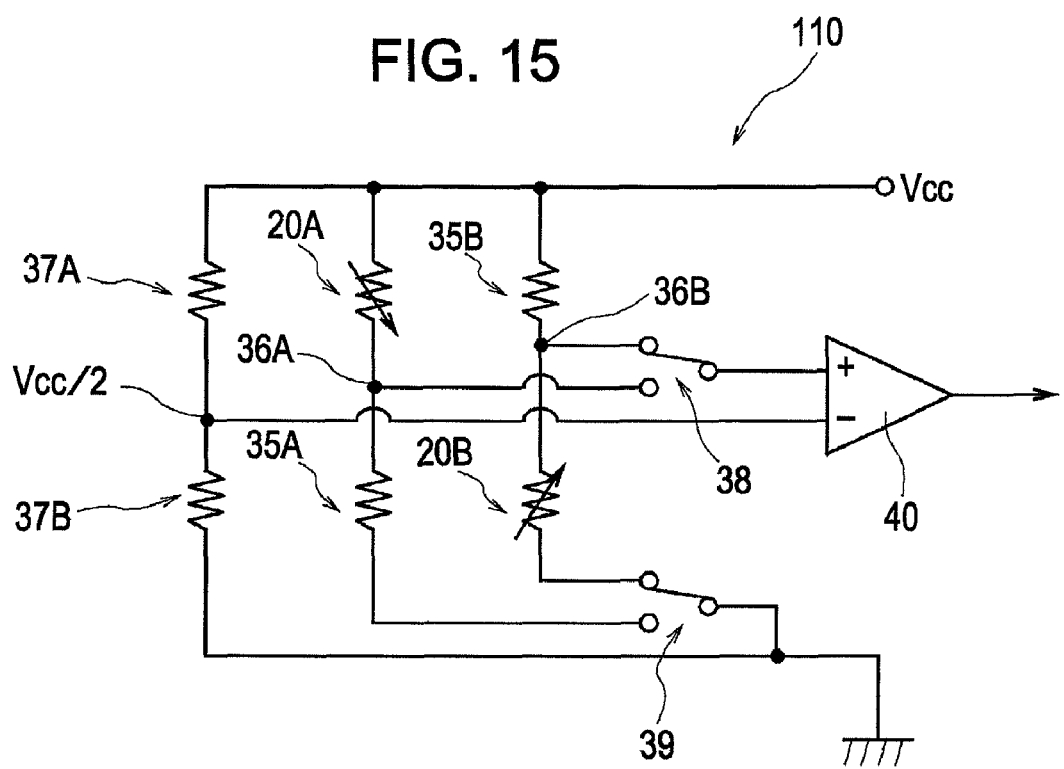
FIG. 15 is a circuit diagram of a detector according to another embodiment of the present invention.

The detector 10 illustrated in FIG. 13 uses one magnetoresistance effect element 20, but as illustrated in FIG. 15, it is possible to use a detector 110 composed of a circuit using two magnetoresistance effect elements 20A and 20B. The magnetoresistance effect elements 20A and 20B used in the detector 110 are the same as the magnetoresistance effect element 20 illustrated in FIGS. 11A and 11B and FIG. 12. Alternatively, it is also possible to use the detector which does not include the magnets 33 and 34.

In the one magnetoresistance effect element 20A, the direction (P direction) of the fixed magnetization of the fixed magnetic layer 24 faces the Y1 direction, but in the other magnetoresistance effect element 20B, the direction (P direction) of the fixed magnetization of the fixed magnetic layer 24 faces the Y2 direction. That is, the magnetoresistance effect element 20A and the magnetoresistance effect element 20B are elements having the same characteristic, but the arrangement directions are mutually opposite with respect to the Y1 direction and the Y2 direction.

As illustrated in FIG. 15, in the detector 110, the magnetoresistance effect element 20A and a fixed resistance element 35A are connected in series. In addition, a fixed resistance element 35B and the magnetoresistance effect element 20B are connected in series. Then, by way of a switch 39, with respect to the magnetoresistance effect element 20A and the fixed resistance element 35A, or with respect to the fixed resistance element 35B and the magnetoresistance effect element 20B, a direct-current power source voltage Vcc is alternately applied. In addition, by way of a switch 38 operating in synchronism with the switch 39, an intermediate point 36A and an intermediate point 36B is alternately selected. The electric resistance of the fixed resistance element 35A is equal to that of the fixed resistance element 35B.

Figure 16:
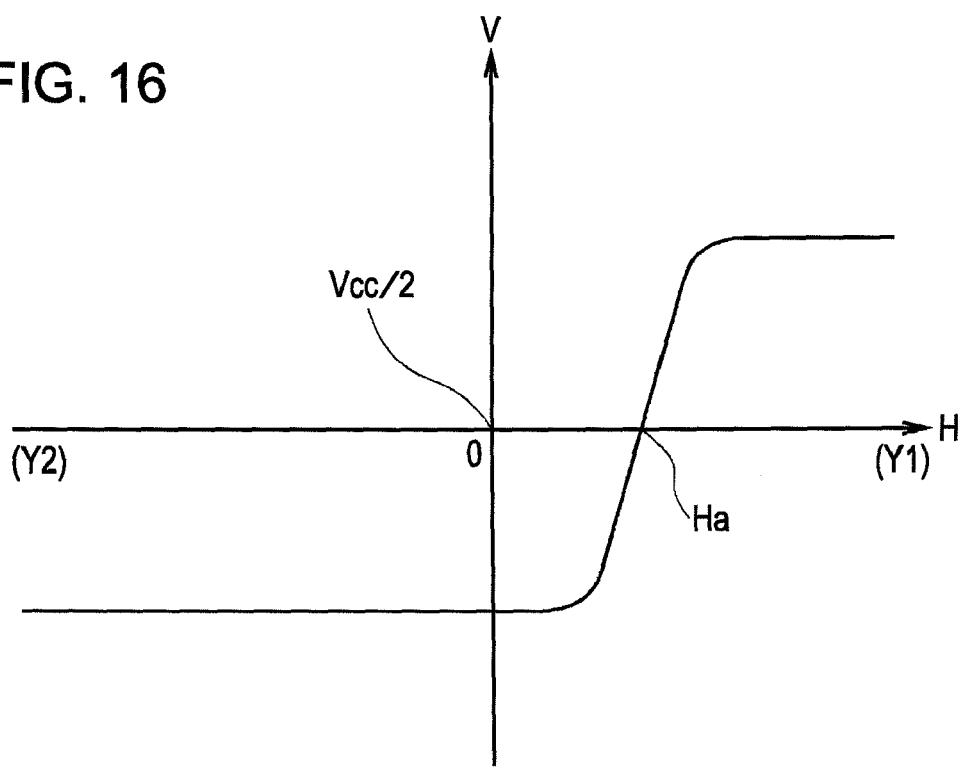
FIG. 16 is a line diagram of an output characteristic obtained from a detector according to another embodiment of the present invention.
Figure 17:
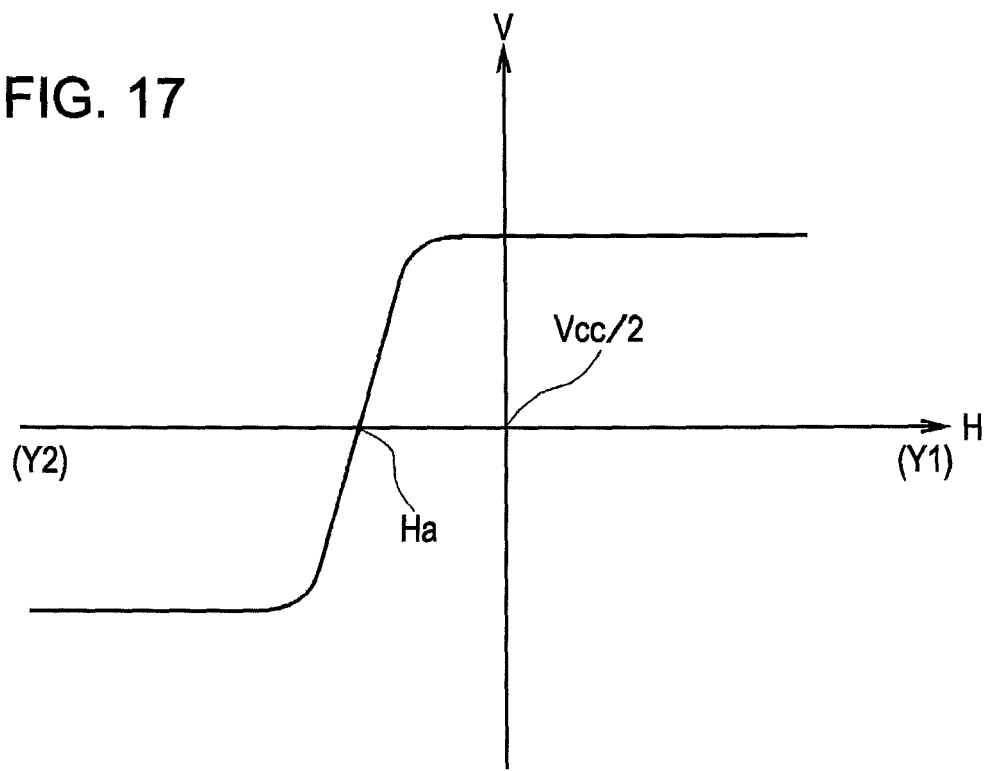
FIG. 17 is a line diagram of an output characteristic obtained from a detector according to another embodiment of the present invention.

FIG. 16 illustrates the direction and the magnitude of the external magnetic field when the magnetoresistance effect element 20A and the fixed resistance element 35A are applied with the direct-current voltage and a variation character of the voltage at the intermediate point 36A. In addition, FIG. 17 illustrates the direction and the magnitude of the external magnetic field when the fixed resistance element 35B and the magnetoresistance effect element 20B are applied with the direct-current voltage and a variation character of the voltage at the intermediate point 36B.

As illustrated in FIG. 15, in the detector 110, reference electrodes 37A and 37B to which the power source voltage Vcc is applied are provided. A reference voltage at an intermediate point between the reference electrode 37A and the reference electrode 37B is set as Vcc/2. By way of a switching timing of the switch 39 and a switching timing of the switch 38, a + terminal of a comparator 40 is alternately applied with the voltage at the intermediate point 36A and the voltage at the intermediate point 36B. In addition, a − terminal of the comparator 40 is applied with the reference voltage Vcc/2.

A control unit (not shown) is adapted to monitor the output from the comparator 40 when the output voltage from the intermediate point 36A is supplied to the comparator 40 through the switching of the switch 38 and the switch 39. When the output becomes +, it is possible to determined that the size of the external magnetic field in the Y1 direction becomes equal to or larger than Ha. In addition, the control unit is adapted to monitor the output from the comparator 40 when the output voltage from the intermediate point 36B is supplied to the comparator 40. When the output becomes −, it is possible to determined that the size of the magnetic field in the Y2 direction becomes equal to or larger than Hb.

In the electronic device 1 illustrated in FIGS. 1 and 2 and the electronic device 101 illustrated in FIG. 3, the magnetic field generated from the magnet 8 which rotates with the rotation unit 3 is detected by the detector 10 (or the detector 110).

In the electronic device 1 illustrated in FIG. 2 and the electronic device 101 illustrated in FIG. 3, when the rotation unit 3 is in the closure posture (a), the cubic shaped magnet 8 faces perpendicularly, in which the N pole faces upward, and the S pole faces downward. In FIGS. 2 and 3, the positional relations between the magnet 8 and the detector 10, and the rotation supporting points 6a and 6b in the electronic device 1 or the electronic device 101 are illustrated by using dimensions (mm).

Figure 4:
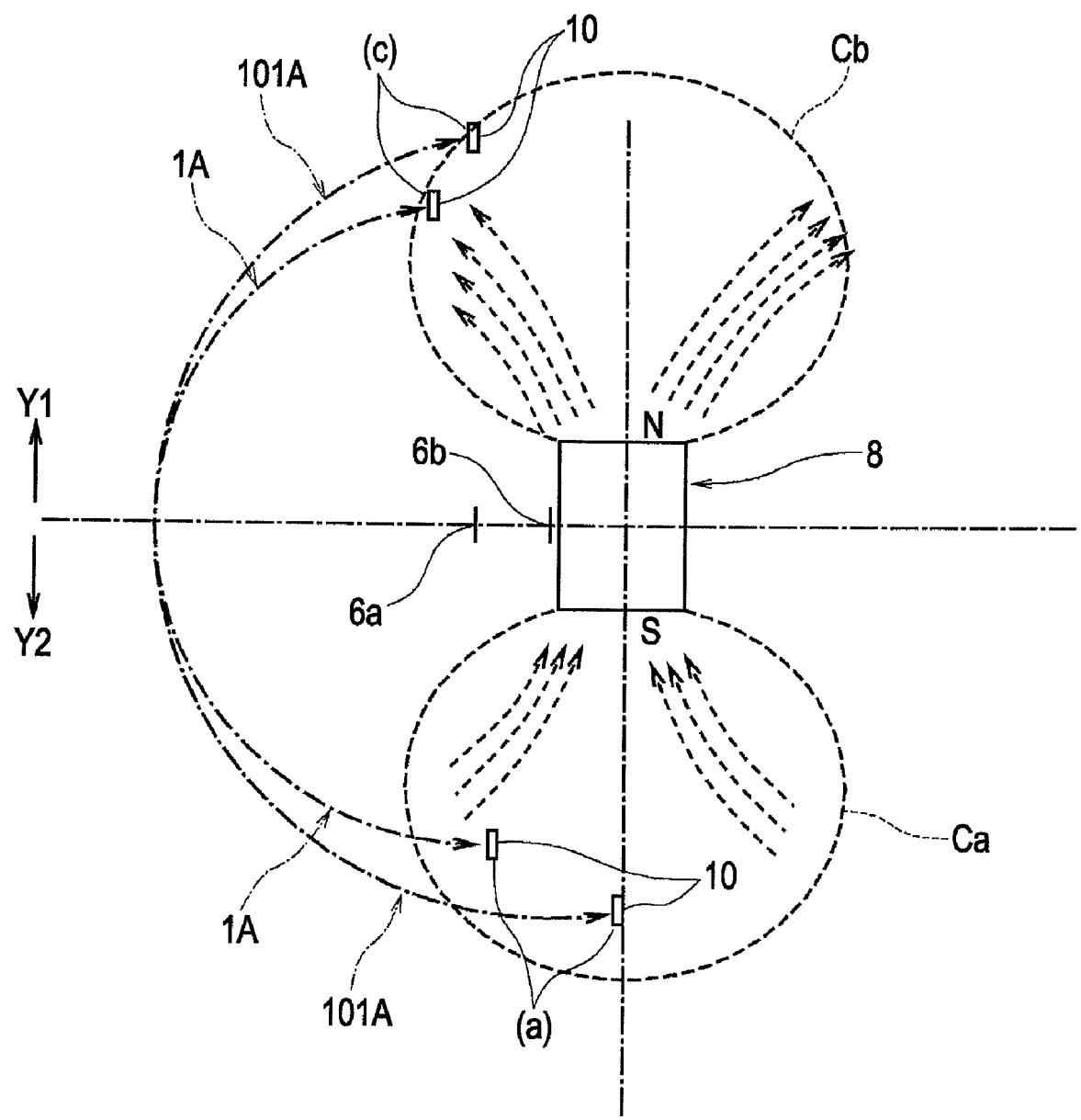
FIG. 4 is an explanatory diagram for describing a relative positional relation between a magnet and a detector in the electronic device according to the first embodiment and the modified example of the first embodiment.

In FIG. 4, the lines of magnetic force generated from the N pole and the lines of magnetic force returning to the S pole are illustrated. Ca and Cb represent isopiestic lines indicating that the components of the intensity in the Y1 direction have the same value. According to the embodiment of FIG. 4, the magnetic field intensity in the Y1 direction is approximately 3 mT on the isopiestic lines Ca and Cb.

In FIG. 4, 1A represents a relative rotation trajectory of the detector 10 with respect to the position of the rotation supporting point 6a of the rotation unit 3 in the electronic device 1 illustrated in FIG. 2 and the magnet 8. Similarly, 101 A represents a relative rotation trajectory of the detector 10 with respect to the position of the rotation supporting point 6b of the rotation unit 3 in the electronic device 101 illustrated in FIG. 3 and the magnet 8. The detector 10 moves on the rotation trajectory 1A and the rotation trajectory 101A. The position of the detector 10 in the closure posture is represented by (a) and position in the rotation limit posture of the detector 10 after the rotation at 180 degrees is represented by (c).

Figure 5:
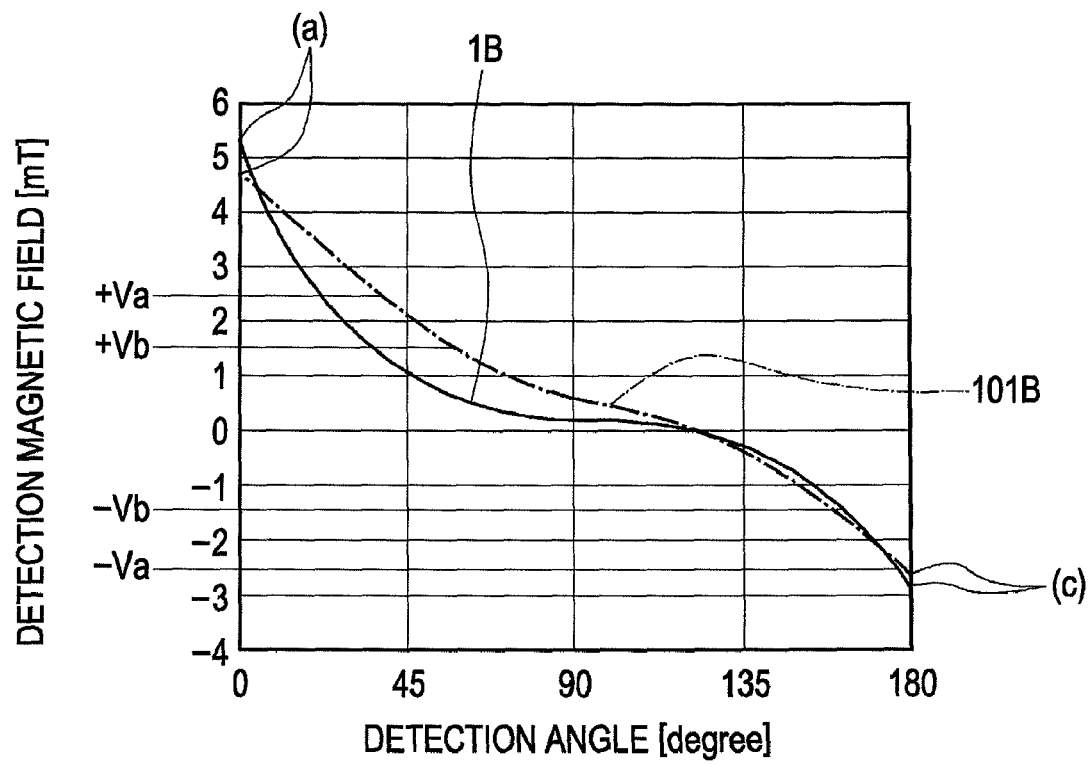
FIG. 5 is a line diagram of a relation between a rotation angle of a rotation unit and an output from the detector in the electronic device according to the first embodiment and the modified example of the first embodiment.

In FIG. 5, 1B represents a curve indicating a relation between the rotation angle of the rotation unit 3 and the magnetic field-intensity detected by the detector 10 in the electronic device 1, and 101B represents a curve indicating represents a curve indicating the rotation angle of the rotation unit 3 and the magnetic field intensity detected by the detector 10 in the electronic device 101. As the direction of the magnetic field affecting the detector 10 is changed while the rotation unit 3 is rotated from the closure posture (a) at 180 degrees up to the rotation limit position (c), the vertical axis of FIG. 5 shows that the magnetic field has the polar characters of + and −.

The detector 10 has the output characteristic equivalent to that of FIG. 14. In the control unit, four thresholds are set in the detector 10. Thresholds +Va and −Va shown in FIG. 5 are set so as to detect that the absolute values of the magnetic field intensities are both set as 2.5 mT. In addition, thresholds +Vb and −Vb are set so as to detect that the absolute values of the magnetic field intensities are both set as 1.5 mT.

In the electronic device 1 illustrated in FIG. 2 and the electronic device 101 illustrated in FIG. 3, when the rotation unit 3 is rotated at a predetermined angle from the closure posture (a) to the rotation limit position (c), the detection output from the detector 10 (output voltage) is lower than the threshold +Vb. The detection output at this time is a first open detection output. When the rotation unit 3 is further rotated, immediately before reaching the rotation limit position (c), the detection output from the detector 10 exceeds the threshold −Va. The detection output at this time is a second open detection output.

Next, when the rotation unit 3 is rotated from the rotation limit position (c) to the closure posture (a), the detection output from the detector 10 passes the threshold −Vb. The detection output at this time is a second closure detection output. When the rotation unit 3 is further rotated toward the closure posture (a), the detection output from the detector 10 passes the threshold +Va. The detection output at this time is the first closure detection output.

In the detector 10 used according to this embodiment, the absolute values of the threshold +Va and the threshold −Va are equal to each other, and the absolute values of the threshold +Vb and the threshold −Vb are equal to each other. The characteristics in the detection are symmetry to each other at a border where the magnetic field is zero. Therefore, a detector with a high general versatility can be used as the detector 10. It should be noted that the positions of the magnet 8 and the detector 10 are asymmetrically arranged to the positions of the rotation supporting points 6a and 6b, and thus, as illustrated in FIG. 5, in both the electronic device 1 and the electronic device 101, the position of the rotation unit 3 when the first open detection output (+Vb) is obtained and the position of the rotation unit 3 when the second open detection output (−Va) is obtained can be set as bilaterally asymmetric angle postures with respect to the orthogonal direction. In addition, the position of the rotation unit 3 when the second closure detection output (−Vb) is obtained and the position of the rotation unit 3 when the first closure detection output (+Va) is obtained can be set as bilaterally asymmetric with respect to the orthogonal direction.

In the electronic device 1 illustrated in FIG. 2, the rotation angle from the closure posture (a) until the first open detection output (+Vb) is obtained as the rotation unit 3 is rotated from the closure posture (a) to the open posture is 37 degrees. Furthermore, the rotation angle from the closure posture (a) until the second open detection output (−Va) is obtained from the closure posture (a) is 178 degrees. In addition, in a case where the rotation unit 3 is rotated from the rotation limit position (c) to the closure posture (a), the opening angle of the rotation unit 3 from the closure posture (a) when the second closure detection output (−Vb) is obtained is 161 degrees. Furthermore, the opening angle of the rotation unit 3 from the closure posture (a) when the first closure detection output (+Va) is obtained is 22 degrees.

In the electronic device 101 illustrated in FIG. 3, the rotation angle from the closure posture (a) until the first open detection output (+Vb) is obtained as the rotation unit 3 is rotated from the closure posture (a) to the open posture is 60 degrees. Furthermore, the rotation angle from the closure posture (a) until the second open detection output (−Va) is obtained is 177 degrees. In addition, in a case where the rotation unit 3 is rotated from the rotation limit position (c) to the closure posture (a), the opening angle of the rotation unit 3 from the closure posture (a) when the second closure detection output (−Vb) is obtained is 164 degrees. Furthermore, the opening angle of the rotation unit 3 from the closure posture (a) when the first closure detection output (+Va) is obtained is 38.5 degrees.

As described above, when the rotation unit 3 is rotated from the closure posture (a), the rotation angle from the closure posture (a) until the first open detection output (+Vb) is obtained is smaller than the rotation angle after the second open detection output (−Va) is obtained until reaching the rotation limit position (c). Furthermore, the rotation angle of the rotation unit 3 from the closure posture (a) until the first closure detection output (+Va) is obtained is smaller than the rotation angle of the rotation unit 3 after the second open detection output (−Va) until reaching the rotation limit position (c).

In the control unit, when the rotation unit 3 starts rotating from the closure posture (a) and obtains the first open detection output (+Vb), the display unit 7 is turned ON and information is displayed on the display unit 7. Then, when the second open detection output (−Va) is obtained, display of the screen on the display unit 7 is inversed 180 degrees so that the display screen may be turned upside down. With this configurations it is possible to use the electronic device 1 in a so-called presentation mode in which the display content on the display unit 7 is presented to a person on a side facing an operator of the electronic device 1.

As compared with the rotation angle of the rotation unit 3 from the closure posture (a) until the first open detection output (+Vb) is obtained, the rotation angle of the rotation unit 3 after the second open detection output (−Va) is obtained until reaching the rotation limit position (c) is sufficiently small. In the electronic device 1 illustrated in FIG. 2, the rotation angle of the rotation unit 3 until the second open detection output (−Va) is obtained is 178 degrees. In the electronic device 101 illustrated in FIG. 3, the rotation angle of the rotation unit 3 until the second open detection output (−Va) is obtained is 177 degrees.

In this manner, as the display state of the display unit 7 is switched immediately before reaching the rotation limit position (c) where the rotation angle of the rotation unit 3 becomes 180 degrees, when the display unit 7 faces the operator who is facing the device main body unit 2, it is possible to prevent unintentional switching of the display content of the display unit 7.

In addition, in a case where when the rotation unit 3 at the rotation limit position (c) is rotated toward the closure posture (a), when the second closure detection output (−Vb) is obtained, the display content of the display unit 7 is returned to the original state. That is, the display content switched to be turned upside down is returned to the original state.

When the rotation unit 3 is rotated from the rotation limit position (c) toward the closure posture (a), the rotation angle from the rotation limit position (c) until the second closure detection output (−Vb) is obtained is larger than the rotation angle after the second open detection output (−Va) is obtained until reaching the rotation limit position (c). Therefore, when the rotation unit 3 is rotated toward the rotation limit position (c), the display content of the display unit 7 is switched to be turned upside down immediately before reaching the rotation limit position (c). Then, when the rotation unit 3 is returned from the rotation limit position (c), the display content of the display unit 7 is not returned to the original state unless the rotation unit 3 is rotated at a certain level of angle. In the electronic device 1 illustrated in FIG. 2, the rotation angle from the rotation limit position (c) until the second closure detection output (−Vb) is obtained is 19 degrees, and in the electronic device 101 illustrated in FIG. 3, the rotation angle is 16 degrees.

With the above-described configuration, after the display content of the display unit 7 is switched to be turned upside down, even when the rotation unit 3 is slightly moved, it is possible to prevent the display content from being returned to the original state. Therefore, while the display content of the display unit 7 is switched and the presentation is being performed, it is possible to prevent the unintentional switching of the display content of the display unit 7.

In addition, in a case where the rotation unit 3 is rotated toward the closure posture (a), when the first closure detection output (+Va) is obtained, the display of the display unit 7 is turned OFF. As compared with the rotation angle of the rotation unit 3 until the first open detection output (+Vb) is obtained to turn ON the display unit 7 while the rotation unit 3 is rotated from the closure posture (a), the rotation angle of the rotation unit 3 after the first closure detection output (+Va) is obtained to turn OFF the display unit 7 until reaching the closure posture (a) is small.

In a case where the rotation unit 3 is rotated from the closure posture (a), as the display unit 7 is turned ON only after the rotation unit 3 is rotated largely to some extent, it is possible to prevent waste of the electric power while the rotation unit 3 is slightly moved and the display unit 7 is unintentionally turned ON. On the other hand, after the display unit 7 is turned ON, unless the rotation unit 3 is rotated to a position in the vicinity of the closure posture (a), the display unit 7 is not turned OFF. Therefore, while the information is displayed on the display unit 7, even when the rotation unit 3 is slightly rotated, it is possible to prevent the display unit 7 from being turned OFF.

In addition, in the electronic device 1 illustrated in FIG. 2 and the electronic device 101 illustrated in FIG. 3, the magnet 8 is arranged at a position away from the rotation supporting points 6a and 6b and also on the center side of the rotation unit 3 as compared with the rotation supporting points 6a and 6b, and therefore the arrangement position of the magnet 8 is easily selected.

Figure 6:
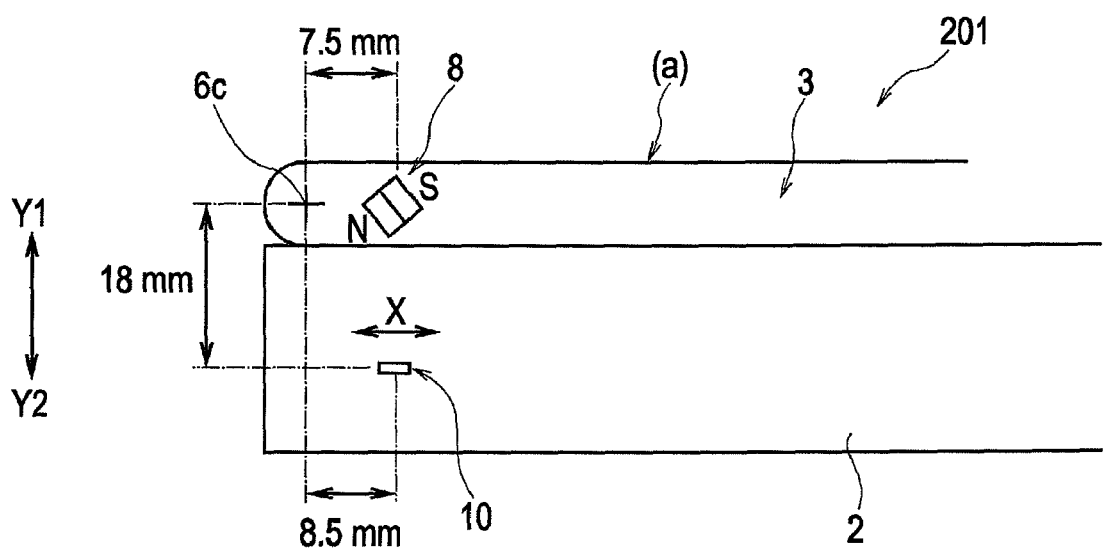
FIG. 6 is a side view of an electronic device according to a second embodiment of the present invention.

FIG. 6 illustrates an electronic device 201 according to a second embodiment of the present invention.

In the electronic device 201, the rotation unit 3 is provided with the magnet 8, and inside the device main body unit 2, the detector 10 is arranged. The magnet 8 is provided at a position closer to the center side of the rotation unit 3 than a rotation supporting point 6c. In addition, the magnet 8 is arranged at 45 degrees with respect to the X direction and the Y direction at a tilt. When the rotation unit 3 is in the closure posture (a), the north pole side faces obliquely downward, and the south pole side faces obliquely upward. In the detector 10 arranged inside the device main body unit 2, the longitudinal direction of the element parts 21 illustrated in FIG. 11A faces in a direction orthogonal to the paper surface, and the direction in which the plurality of element parts 21 are arranged is the X direction. Therefore, the detector 10 can detect the component in the X direction of the magnetic field generated from the magnet 8. In addition, the positional relation of the rotation supporting point 6c and the magnet 8 and the detector 10 is as indicated by the dimensions shown in FIG. 6.

Figure 7:
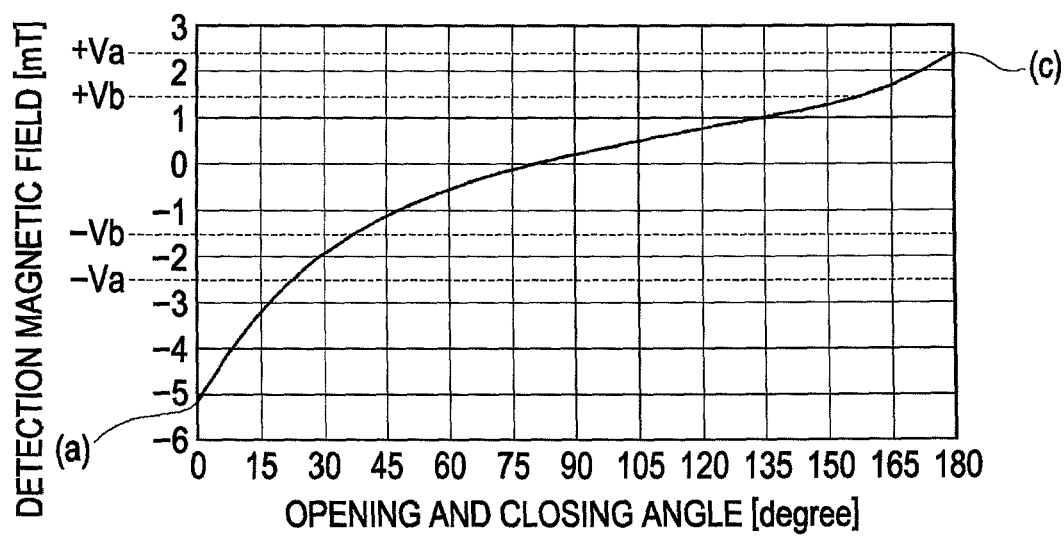
FIG. 7 is a line diagram of a relation between the rotation angle of the rotation unit and the output from the detector in the electronic device according to the second embodiment.

FIG. 7 illustrates a relation of the angle at which the rotation unit 3 is rotated from the closure posture (a) up to the rotation limit position (c) and the magnetic field intensity in the X direction detected by the detector 10.

The threshold for obtaining the first open detection output is −Vb. The rotation angle of the rotation unit 3 until the first open detection output (+Vb) is obtained from the closure posture (a) is 36 degrees. The threshold for obtaining the second open detection output is +Va. The rotation angle of the rotation unit 3 until the second open detection output (+Va) is obtained from the closure posture (a) is 178 degrees.

The threshold for obtaining the second closure detection output is +Vb. The rotation angle of the rotation unit 3 when the second closure detection output is obtained from the closure posture (a) is 158 degrees. The threshold for obtaining the first closure detection output is −Va. The rotation angle of the rotation unit 3 when the first closure detection output is obtained from the closure posture (a) is 21 degrees.

Therefore, the timings at which the display unit 7 is turned ON and OFF and the timing at which the display content of the display unit 7 is switched can be set similarly to the electronic device 1 illustrated in FIG. 2 and the electronic device 101 illustrated in FIG. 3.

Figure 8:
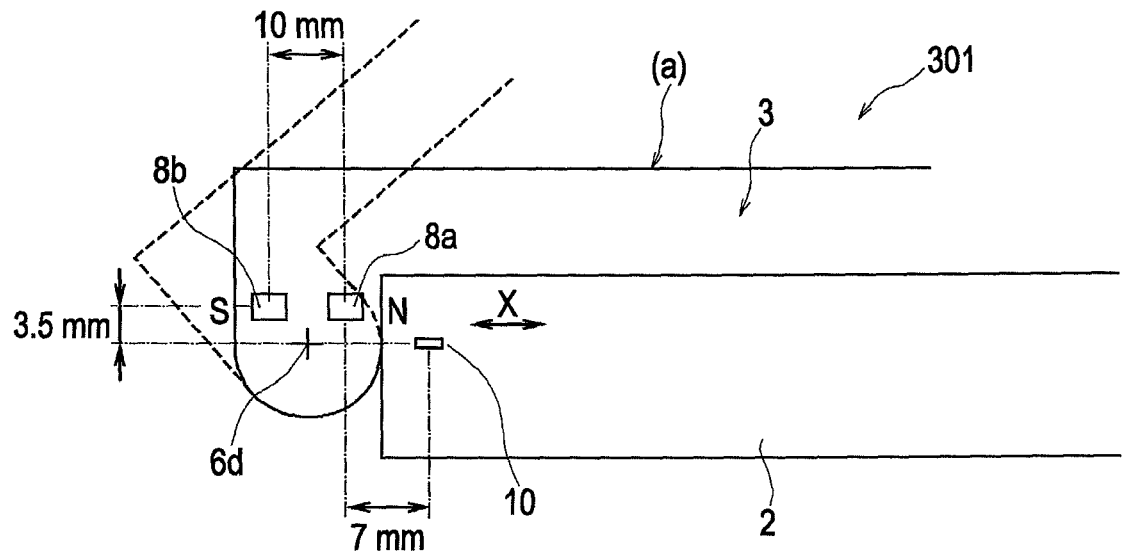
FIG. 8 is a side view of an electronic device according to a third embodiment of the present invention.

FIG. 8 illustrates an electronic device 301 according to a third embodiment of the present invention.

In the electronic device 301, a rotation supporting point 6d of the rotation unit 3 is located in a back side as compared with the end part of the device main body unit 2. In the rotation unit 3, two magnets 8a and 8b are provided. the magnet 8a and the magnet 8b are separately arranged on the right side and the left side at positions away from the rotation supporting point 6d while sandwiching the rotation supporting point 6d. The face of the magnet 8a facing the right side is the north pole. The face of the magnet 8b facing the left side is the south pole. In the device main body unit 2, the detector 10 is provided.

The direction of the magnetic field detected by the detector 10 is the X direction. The arrangement positions for the magnets 8a and 8b with respect to the rotation supporting point 6d and the arrangement position for the detector 10 are as the dimensions shown in FIG. 8.

In the detector 10, four thresholds are set. As illustrated in FIG. 8, when the rotation unit 3 is in the closure posture (a), the magnet 8a and the magnet 8b are positioned on an upper side than the rotation supporting point 6d, and the detector 10 is positioned at the same height as the rotation supporting point 6d. As a result, the rotation angle from the closure posture (a) when the first open detection output is obtained as the rotation unit 3 starts rotating from the closure posture (a) is 26 degrees. The rotation angle from the closure posture (a) when the second open detection output is obtained is 167 degrees. It should be noted that the rotation angle up to the rotation limit position (c) is 180 degrees.

In addition, the opening angle from the closure posture (a) of the rotation unit 3 when the second closure detection output is obtained is 154 degrees. The opening angle from the closure posture (a) of the rotation unit 3 when the first closure detection output is obtained is 13 degrees.

Figure 9:
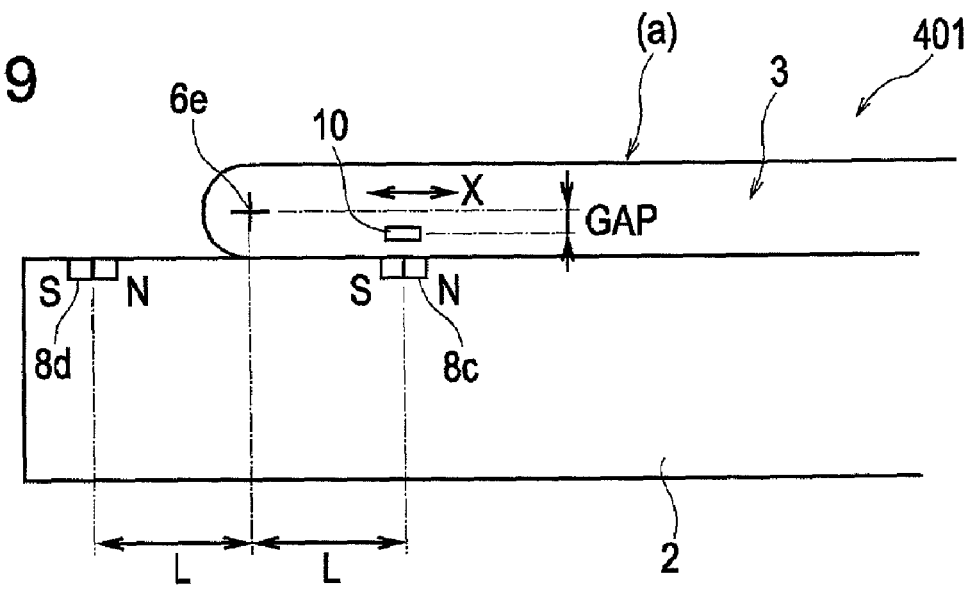
FIG. 9 is a side view of an electronic device according to a fourth embodiment of the present invention.

FIG. 9 illustrates an electronic device 401 according to a fourth embodiment of the present invention.

In the electronic device 401, the rotation unit 3 is provided with the detector 10, and the device main body unit 2 is provided with a magnet 8c and a magnet 8d. When the rotation unit 3 is in the closure posture (a), the detection direction of the magnetic field of the detector 10 is the X direction. In addition, the rotation unit 3 is in the closure posture (a), the detector 10 does not exist at the same height as a rotation supporting point 6e, and the detector 10 is located on a closer side to the device main body unit 2 as compared with the rotation supporting point 6e. The magnet 8c and the magnet 8d are arranged at position away from the position of the rotation supporting point 6e at an equal distance on the left and right sides.

As illustrated in FIG. 9, when the rotation unit 3 is in the closure posture (a), the detector 10 is positioned on a lower side of the rotation supporting point 6e. The rotation angles for obtaining the first open detection output and the second open detection output and the rotation angles for obtaining the second closure detection output and the first closure detection output can be set similarly to the electronic devices 1, 101, 201, and 301 according to the above-described respective embodiments.

Figure 10:
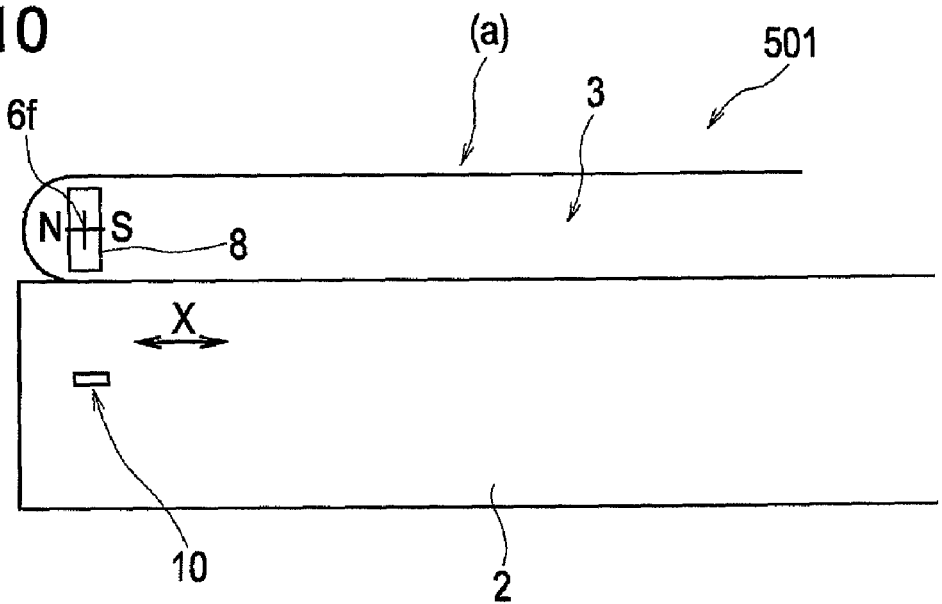
FIG. 10 is a side view of an electronic device according to a fifth embodiment of the present invention.

FIG. 10 illustrates an electronic device 501 according to a fifth embodiment of the present invention.

According to this embodiment, in the rotation unit 3, the magnet 8 is positions on a rotation central line of a rotation supporting point 6f. In the device main body unit 2, the detector 10 is positioned immediately below the rotation supporting point 6f. The direction of the magnetic field detected by the detector 10 is the X direction.

In the electronic device 501 illustrated in FIG. 10, the rotation angle from the closure posture (a) until the first open detection output is obtained is the same as the rotation angle after the second open detection output is obtained until reaching the rotation limit position (c).

What is claimed is:
1. An electronic device comprising:
a device main body unit;
a rotation unit freely rotatably supported to the device main body unit;
a display unit provided to the rotation unit, the rotation unit rotating between a closure posture in which the display unit faces the device main body unit and a display posture in which the display unit is away from the device main body;

a magnet provided to one of the device main body unit and the rotation unit; and a detector provided to the other of the device main body unit and the rotation unit, wherein:

diverse magnetic poles of the magnet are arranged in mutually opposite directions in a surface orthogonal to a rotation central line of the rotation unit;

the detector has a fixed magnetic layer in which a direction of magnetization is fixed and a free magnetic layer in which the magnetization is changed due to external magnetic field and is composed of a magnetoresistance effect element capable of detecting the direction and intensity of the external magnetic field on the basis of the direction of the magnetization of the fixed magnetic layer and the direction of the magnetization of the free magnetic layer; and the detector detects an intensity change of the magnetization in one direction output from the magnet and obtains a first open detection output when the rotation unit is rotated at a predetermined angle from the closure posture to the display posture, and the detector detects an intensity change of the magnetization in the other direction output from the magnet and obtains a second open detection output when the rotation unit is further rotated toward the display posture after the first open detection output is obtained.

2. The electronic device according to claim 1, wherein when the rotation unit is rotated at an angle above 150 degrees from the closure posture, the second open detection output is obtained from the detector.

3. The electronic device according to claim 1, wherein when the first open detection output is obtained as the rotation unit is rotated from the closure posture to the display posture, a display of the display unit is turned ON, and when the second open detection output is obtained, a display content of the display unit is switched.

4. The electronic device according to claim 2, wherein when the first open detection output is obtained as the rotation unit is rotated from the closure posture to the display posture, a display of the display unit is turned ON, and when the second open detection output is obtained, a content displayed on the display unit is turned upside down to be displayed.

5. The electronic device according to claim 4, wherein an angle and a direction of the magnet and the detector are set to have a rotation angle of the rotation unit up to a rotation limit position of the display posture is reached after the second open detection output is obtained, smaller than a rotation angle of the rotation unit from the closure posture up to an angle at which the first open detection output is obtained.

6. The electronic device according to claim 4, wherein when the rotation unit is rotated at a predetermined angle from a rotation limit position of the display posture to the closure posture, a second closure detection output is obtained, and when the rotation unit is rotated at a predetermined angle toward the closure posture after the second closure detection output is obtained, a first closure detection output is obtained.

7. The electronic device according to claim 6, wherein a rotation angle of the rotation unit from the rotation limit position up to an angle at which the second closure detection output is obtained is larger than a rotation angle of the rotation unit up to the rotation limit position after the second closure detection output is obtained.

8. The electronic device according to claim 7, wherein when the second closure detection output is obtained as the rotation unit is rotated from the rotation limit position toward the closure posture, the display content of the display unit is returned to an original state.

9. The electronic device according to claim 6, wherein a rotation angle of the rotation unit toward the closure posture after the first closure detection output is obtained is smaller than a rotation angle of the rotation unit from the closure posture up to an angle at which the first closure detection output is obtained.

10. The electronic device according to claim 9, wherein when the first closure detection output is obtained as the rotation unit is rotated toward the closure posture, the display of the display unit is turned OFF.

11. The electronic device according to claim 1, wherein the detector includes a detection element adapted to utilize a magnetoresistance effect.

* * * * *